United States Patent [19]

Volk et al.

[11] Patent Number: 4,983,933

[45] Date of Patent: Jan. 8, 1991

[54] WAVEGUIDE-TO-STRIPLINE DIRECTIONAL COUPLER

[75] Inventors: Paul R. Volk; Thomas R. Debski, both of Farmingdale, N.Y.

[73] Assignee: Sedco Systems Inc., Long Island, N.Y.

[21] Appl. No.: 417,415

[22] Filed: Oct. 5, 1989

[51] Int. Cl.$^5$ ............................................... H01P 5/18
[52] U.S. Cl. ..................................... 333/109; 333/113; 333/116
[58] Field of Search ..................... 333/109, 113, 116

[56] References Cited

U.S. PATENT DOCUMENTS

| | | | |
|---|---|---|---|
| 3,587,004 | 6/1971 | Parad | 333/109 |
| 3,721,921 | 3/1973 | Lamy et al. | 333/109 |
| 4,122,449 | 10/1978 | Endo | 333/116 X |
| 4,433,313 | 2/1984 | Saint et al. | 333/109 |

Primary Examiner—Paul Gensler
Attorney, Agent, or Firm—Donald F. Mofford; Richard M. Sharkansky

[57] ABSTRACT

A transducer adapted to couple radio frequency (R.F.) energy from a section of waveguide to a section of stripline is shown to comprise a section of stripline supporting a series of probes projecting inside the waveguide with a shaped length of a dielectric material disposed around the probes within the waveguide to match the velocity of propagation of the R.F. energy in the waveguide to the velocity of propagation in the stripline, thereby achieving tight coupling and improved directivity.

9 Claims, 3 Drawing Sheets ly to another transmission system. With the
advent of monolithic microwave integrated circuits and
with increasing use of hybrid integrated circuits, it is
often necessary to couple microwave energy from a
waveguide transmission line to another transmission
system or, alternatively, from another transmission system to a waveguide transmission system. Known microwave transducers include transducers transforming
from a TEM-coaxial mode to a waveguide mode excited by an axial probe or a transverse probe, depending
upon the waveguide mode desired, and transforming
from a waveguide mode to a microstrip mode by gradually tapering the waveguide rectangular section to a
ridged guide that joins to the microstrip line, but such
couplers have loose coupling and poor directivity.
Therefore, a waveguide-to-stripline transducer and a
waveguide-to-coaxial transducer providing tight coupling, good directivity and high power handling capability are needed.

WAVEGUIDE-TO-STRIPLINE DIRECTIONAL COUPLER

BACKGROUND OF THE INVENTION

This invention pertains generally to microwave transducers, and more particularly to a transducer adapted to couple radio frequency (R.F.) energy from waveguide to stripline.

As it is known in the art, transducers are often necessary to couple R.F. energy from a waveguide transmission system to another transmission system. With the advent of monolithic microwave integrated circuits and with increasing use of hybrid integrated circuits, it is often necessary to couple microwave energy from a waveguide transmission line to another transmission system or, alternatively, from another transmission system to a waveguide transmission system. Known microwave transducers include transducers transforming from a TEM-coaxial mode to a waveguide mode excited by an axial probe or a transverse probe, depending upon the waveguide mode desired, and transforming from a waveguide mode to a microstrip mode by gradually tapering the waveguide rectangular section to a ridged guide that joins to the microstrip line, but such couplers have loose coupling and poor directivity. Therefore, a waveguide-to-stripline transducer and a waveguide-to-coaxial transducer providing tight coupling, good directivity and high power handling capability are needed.

SUMMARY OF THE INVENTION

With the foregoing background of this invention in mind, it is a primary object of this invention to provide a transducer adapted to couple R.F. energy from waveguide to stripline.

Another object of this invention is to provide a transducer having tighter coupling and improved directivity.

Still another object of this invention is to provide a transducer adapted to couple R.F. energy from a section of waveguide to a coaxial cable, said transducer having tighter coupling and improved directivity.

The foregoing and other objects of this invention are met generally by a transducer adapted to couple R.F. energy having a wavelength, $\lambda$, from a section of waveguide to a section of stripline. The transducer comprises a section of stripline having a series of probes, each probe spaced a quarter wavelength ($\lambda/4$) apart from an adjacent probe, the probes disposed in a wall of the waveguide perpendicular to the E-plane of the R.F. energy. A dielectric material is disposed between the walls of the waveguide, along the section of the waveguide having the probes, for controlling the velocity of propagation of the R.F. energy in the waveguide, thereby matching the velocity of propagation of the R.F. energy in the stripline, and therefore enhancing the coupling of R.F. energy from the waveguide to the stripline. A coaxial cable to stripline connector may be used to further couple the R.F. energy from the stripline to a coaxial cable.

BRIEF DESCRIPTION OF THE DRAWINGS

For a more complete understanding of this invention, reference is now made to the following description of the accompanying drawings, wherein.

Description of the Preferred Embodiment

Figure 1:
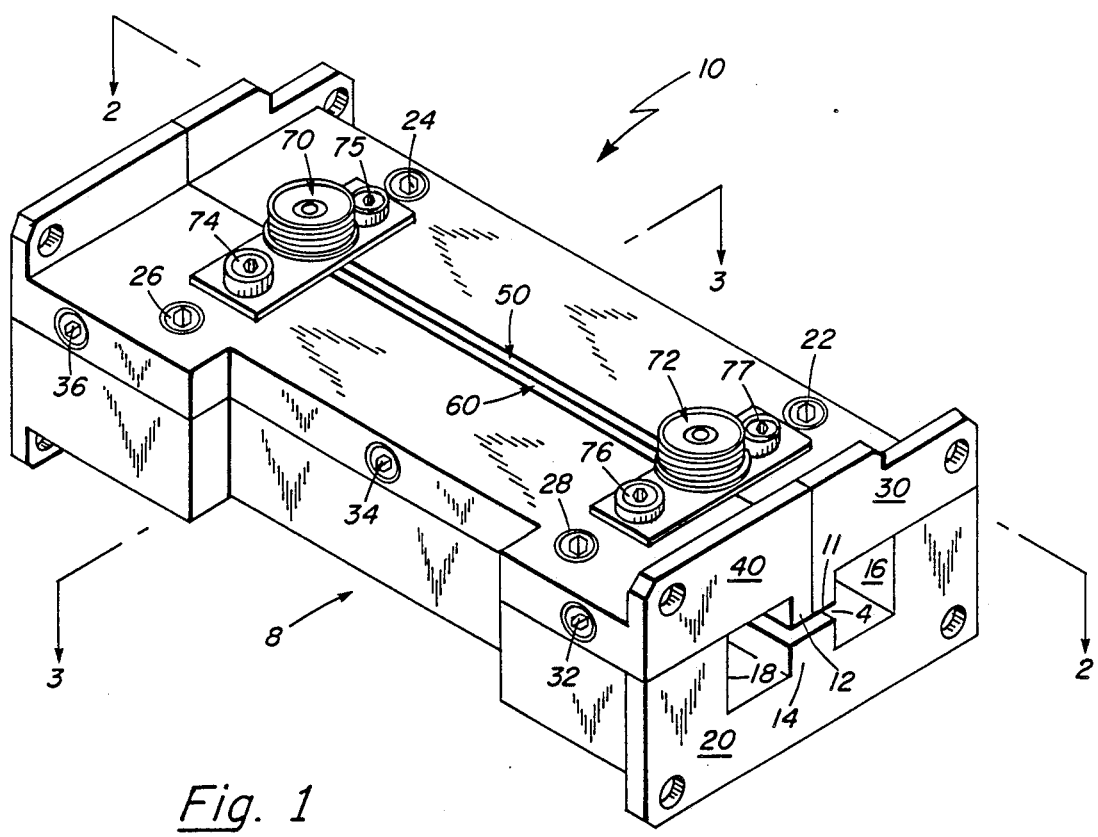
FIG. 1 is an isometric view, somewhat distorted, of a transducer according to this invention.
Figure 2:
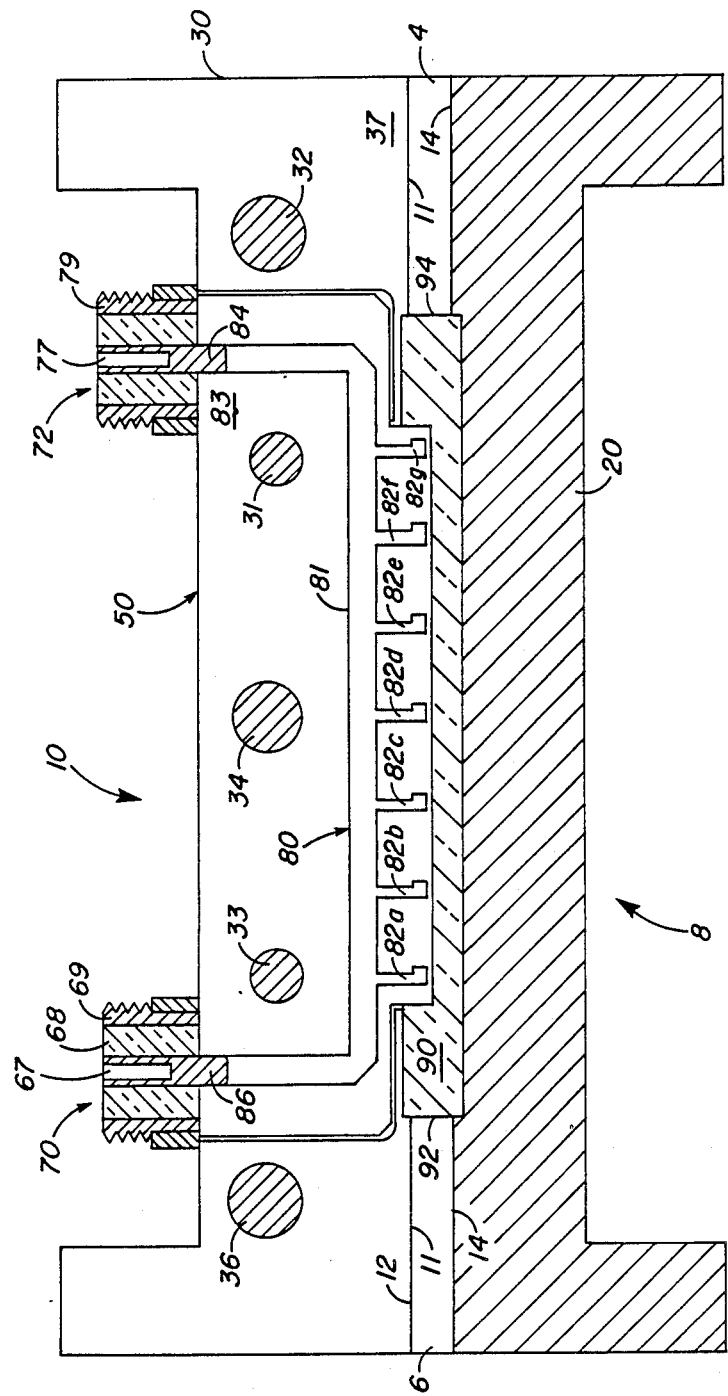
FIG. 2 is a longitudinal cross-sectional view of the transducer shown in FIG. 1, such cross-section being taken along plane 2—2 in FIG. 1.

Referring now to FIG. 1, a transducer 10 is shown comprising waveguide 8 having a bottom section 20, a first top section 30 and a second top section 40, a microstrip assembly 50 shown in greater detail in FIG. 2, a dielectric assembly 60 and a first and a second connector 70, 72. Waveguide 8, having a top ridge 12 including an edge 11, and a bottom ridge 14, is shaped as a conventional double-ridged waveguide for guiding radio frequency energy having a wavelength, and constructed having dimensions appropriate for the desired wavelength. Unlike a conventional ridged waveguide, waveguide 8 is constructed having three sections: bottom section 20, first top section 30 and second top section 40, as shown. First top section 30 and second top section 40 are fabricated as two separate sections such that microstrip assembly 50 and dielectric assembly 60 forming a stripline assembly (not numbered) can be placed in between the sections 30, 40 during the construction of transducer 10. First top section 30 is connected to second top section 40 in any known manner, here by screws 32, 34, 36, as shown. First top section 30 and second top section 40 are connected to bottom section 20 in any known manner, here by screws 22, 24, 26 and 28, as shown.

Waveguide 8 can be connected to a second section of waveguide (not shown), capable of propagating R.F. energy, such that an end of waveguide 8 is mated to an end of the second section of a waveguide (not shown). Mounting holes (not numbered) located at the end of waveguide 8 are used to accommodate screws (not shown) to connect waveguide 8 to the second section of a waveguide (not shown). First connector 70 and second connector 72, which are coaxial cable-to-microstrip connectors, here are utilized to couple R.F. energy from the microstrip circuitry 80 (FIG. 2) to a coaxial cable (not shown). As described hereinafter, transducer 10 is capable of coupling R.F. energy propagating in waveguide 8 to a coaxial cable (not shown) connected to either connector 70 or 72, or alternatively, capable of coupling R.F. energy propagating in a coaxial cable (not shown) connected to either connector 70 or 72, to waveguide 8.

Referring now to FIG. 2, a cross-sectional view of transducer 10, the microstrip assembly 50 disposed adjacent to first top section 30 is shown. Microstrip assembly 50 comprises microstrip circuitry 80 disposed on one surface of a slab 83 of dielectric material with a second opposing surface (not shown) covered by a conductive material (here copper) forming a ground plane. An example of a dielectric material coated with a conductive material is that known as LX-0310-17-22 manufactured by ARLON Corporation of Bear, Del. First top section 30 is shaped so that when the microstrip assembly 50 is in place as shown, surface 37 of first top section 30 and the exposed portions of the microstrip circuitry 80 are coplanar. Microwave circuitry 80 here is shown to comprise a first port 84 connected to a second port 86 by a microstrip lead 81 with probes 82a, 82b, 82c, 82d, 82e, 82f and 82g projecting from the microstrip lead 81, as shown. The spacing between adjacent probes is one-quarter wavelength of the radio frequency energy passing along the microstrip lead 81. Although each one of the probes 82a–g is less than one-quarter wavelength in length (here approximately three-sixteenths of a wavelength long), each probe extends beyond the edge 11 of the top ridge 12. The amount of extension depends upon the amount of coupling desired. The shape of the end of each probe extending into the space in the waveguide 8 between the ridges 11, 14 causes the impedance of each probe 82a–g to be lowered. It will be appreciated that the number of probes should be an odd number of probes, thereby preventing a condition of resonance existing in transducer 10.

Figure 3:
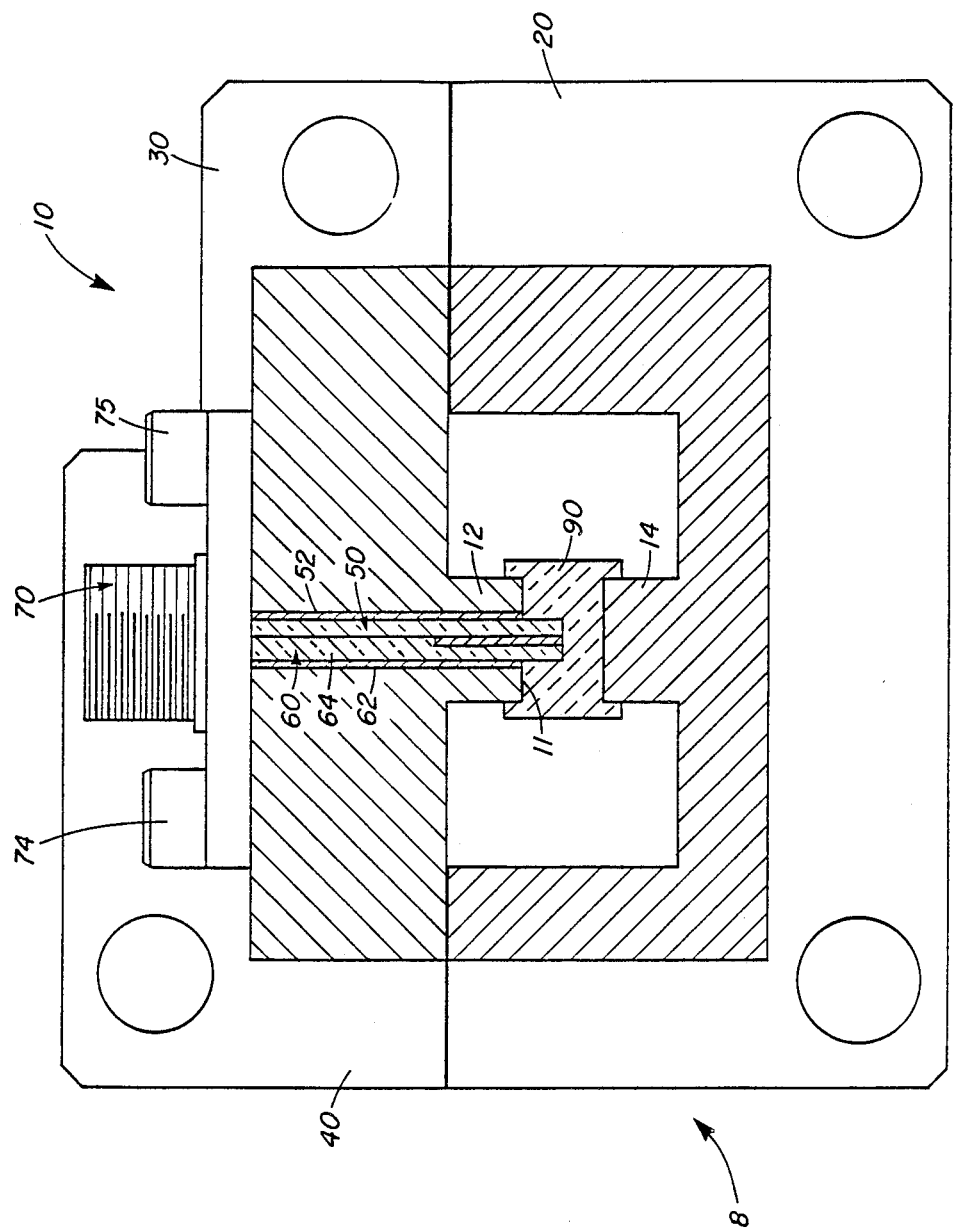
FIG. 3 is a transverse cross-sectional view of the transducer shown in FIG. 1, such cross-section being taken along plane 3—3 in FIG. 1.

Referring now to FIG. 3, microstrip assembly 50 is shown in an operative relationship with dielectric assembly 60 to form a stripline circuit disposed within waveguide 8. Dielectric assembly 60 comprising a slab 64 of dielectric material with an uncoated first surface and a second surface covered with a layer of conductive material (here copper) forming a ground plane 62, is disposed adjacent to microstrip assembly 50 with the uncoated first surface of slab 64 in contact with the microstrip circuitry 80 on microstrip assembly 50. To accomplish such purpose and so the end portions of the first top section 30 and second top section 40 (FIG. 1) remain in contact, the second top section 40 is milled to receive the dielectric assembly 60. Dielectric assembly 60 here is fabricated from dielectric material known as LX-0310-17-82 manufactured by ARLON Corporation of Bear, Del., with the conductive material removed from one surface.

Referring now to FIG. 2 and FIG. 3 together, holes (not shown) are formed in dielectric assembly 60 to correspond with holes (not numbered) formed in microstrip assembly 50 thereby to accommodate screw 34 and dowels 31, 33. It will be obvious that the dowels 31, 33 cause the first top section 30, the second top section 40, the microstrip assembly 50 and the dielectric assembly 60 to be positioned with respect to each other and that the screw 34, along with screws 32, 36 (FIG. 1) causes the just-mentioned elements to be held together as a unitary body.

A shaped strip 90 of dielectric material (here the material known by the trademark "TEFLON," manufactured by E. I. DuPont de Neumours, Inc. of Wilmington, Del.) with a dielectric constant equal to 2.1 is disposed as shown between top ridge 12 and bottom ridge 14 adjacent to the ends of the probes 82a–g. The strip 90 is effective to control the velocity of propagation of R.F. energy in the waveguide 8 so that the velocity of propagation of R.F. energy in the waveguide 8 matches the velocity of propagation of R.F. energy in the microstrip circuitry 80. As described hereinafter, matching the velocity of propagation of the transmission mediums, coupling of R.F. energy between the waveguide 8 and the microstrip circuitry 80 is optimized. Ground planes 52, 62 disposed adjacent to sections 30 40, respectively, extend approximately to the edge 11 of top ridge 12, thereby exposing microstrip circuitry 80 to the R.F. energy propagating in the waveguide.

Referring now to FIG. 2, R.F. energy from a source (not shown; and impressed on port 6 of waveguide 8 propagates toward port 4. When R.F. energy in waveguide 8 reaches probe 82a, a portion of the R.F. energy is coupled to microstrip lead 81. When R.F. energy reaches probe 82b, a second portion of R.F. energy is coupled to microstrip lead 81 by probe 82b. In a like manner, probes 82c–g are operative to couple additional portions of the R.F. energy in waveguide 8 to microstrip lead 81. It will be obvious to one of skill in the art that the quarter wavelength spacing between adjacent pairs of the probes 82a . . . . . 82g makes the disclosed device a directional coupler. That is to say: (a) constructive interference exists between R.F. energy coupled by successive pairs of probes 82a . . . . . 82g when such coupled energy propagates on microstrip lead 81 toward port 84; and (b) destructive interference exists between R.F. energy coupled by successive pairs of probes 82a . . . 82g when such coupled energy propagates on microstrip lead 81 toward port 86.

If, on the other hand, R.F. energy is applied to port 86 of the microstrip circuitry 80: (a) constructive interference exists between R.F. energy coupled by successive pairs of probes 82a . . . . . 82g to the waveguide 8 and moving toward port 4; and (b) destructive interference exists between R.F. energy coupled by successive pairs of probes 82a . . . . . 82g to the waveguide 8 and moving toward port 6.

It will be observed that the inner dimensions of the waveguide 8 change abruptly at the portion of the waveguide 8 where strip 90 is located. To avoid any internal reflections in operation due to impedance discontinuities in the waveguide 8, the dimensions of the waveguide 8 are changed as shown.

To complete the description of the preferred embodiment of this invention, conventional coaxial cable connectors 70, 72 are mounted in any convenient manner adjacent ports 86, 84 as shown. Thus, a center conductor 67 of coaxial cable connector 70 is connected to the microstrip lead 81 at port 86 and a center conductor 77 of coaxial cable connector 72 is connected to the microstrip lead 81 at port 84. The shield of each one of the coaxial cable connectors 70, 72 is connected to the underlying portions of the ground plane 52 of microstrip assembly 50 and to the ground plane 62 of the dielectric assembly 60.

Figure 4:
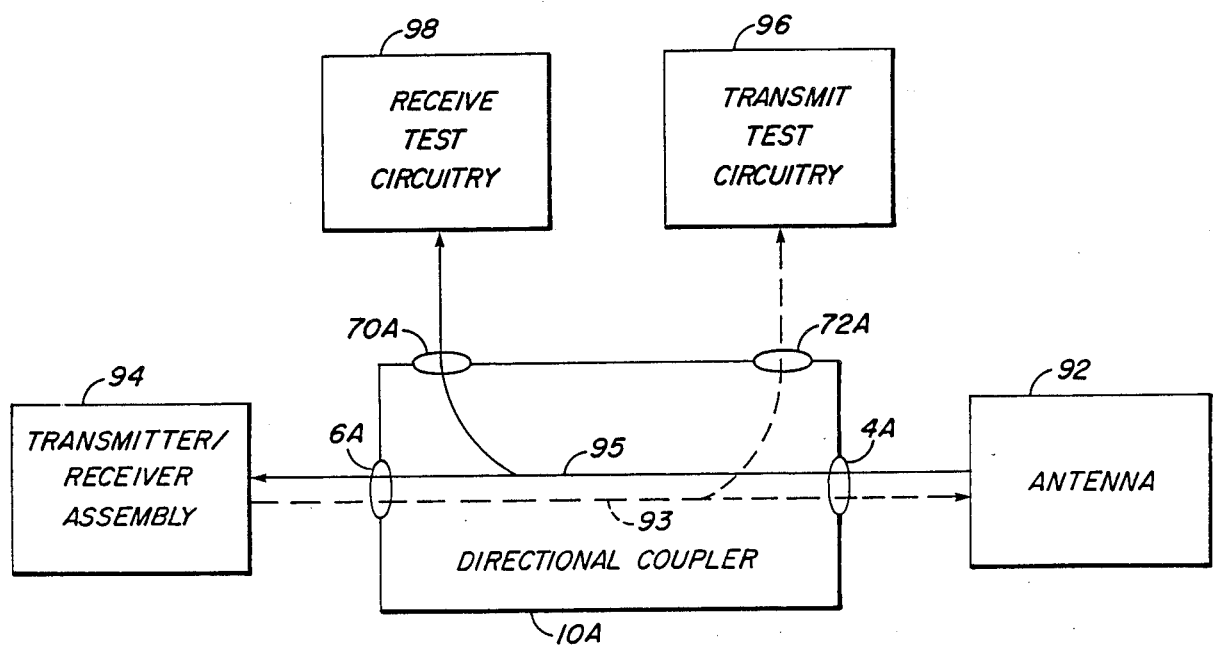
FIG. 4 is a block diagram of a typical application using the transducer.

FIG. 4 shows the just-described transducer 10 in use as a directional coupler in a sampler circuit, with elements corresponding to elements shown in previous FIGURES having the letter A after the numeral used previously. Thus, a directional coupler 10A (identical in structure to transducer 10 (FIG. 1)) is shown to have ports 4A, 6A, 70A, 72A to which a transmitter/receiver assembly 94, an antenna 92, a receiver test circuitry 98 and a transmitter test circuitry 96 are connected, as shown. Thus, R.F. signals out of transmitter/receiver assembly 94 are passed, via ports 6A and 4A, to the antenna 92 and coupled, via port 72A, to transmit test circuitry 96 as indicated by the broken line 93. R.F. signals out of antenna 92 are passed, via ports 4A and 6A, to the transmitter/receiver assembly 94 and coupled, via port 70A, to the receive test circuitry 98 as indicated by the solid line 95.

Alternatively, if R.F. energy is applied to port 70A, then the R.F. energy is passed to port 72A and coupled to port 4A, or if R.F. energy is applied to port 72A, then the R.F. energy is passed to port 70A and coupled to port 6A.

Having described a preferred embodiment of this invention, it will now be apparent to one of skill in the art that the number and disposition of the various probes and the dielectric materials may be changed without affecting this invention. Further, the type of waveguide could be changed or the stripline circuit comprising microstrip assembly 50 and dielectric assembly 60 could be extended to include a desired device fabricated with the microstrip circuitry 80 instead of using connectors 70, 72 to couple to a desired device. Additionally, instead of coupling the electric field, one could sample the magnetic field by disposing stripline circuitry capable of coupling the magnetic field in the H-plane wall. It is felt, therefore, that this invention should not be restricted to its disclosed embodiment, but rather should be limited only by the spirit and scope of the appended claims.

What is claimed is:

1. A transducer for coupling radio frequency (R.F.) energy comprising:
    (a) a section of waveguide having an inner cavity formed from a first and second pair of opposing walls;
    (b) stripline circuitry having a series of probes disposed in one of the first pair of opposing walls and extending into the inner cavity;
    (c) means for coupling R.F. energy traveling along the waveguide in a first direction from the waveguide to the stripline including each probe being one-quarter wavelength of the R.F. energy apart from an adjacent probe in providing:
        (i) constructive interference between the R.F. energy coupled by the probes and moving in the first direction; and
        (ii) destructive interference between the R.F. energy coupled by the probes and moving in a direction opposite the first direction; and
    (d) a strip of dielectric material disposed between the first pair of opposing walls of the waveguide along the section of the waveguide having the probes wherein the strip of dielectric material has a dielectric constant equal to a value such that the velocity of propagation of the R.F. energy in the waveguide having the strip is approximately equal to the velocity of propagation of the R.F. energy in the stripline.

2. The transducer as recited in claim 1 wherein the section of waveguide further comprises means for keeping the impedance along the waveguide substantially constant as the R.F. energy enters the strip of dielectric material.

3. The transducer as recited in claim 2, the transducer further comprising means for coupling R.F. energy from the stripline circuitry to a coaxial cable.

4. The transducer as recited in claim 3 wherein the waveguide is fabricated of double-ridged rectangular waveguide with ridges on the H-plane of such waveguide.

5. The transducer as recited in claim 4 wherein the stripline circuitry is disposed in one of the ridges of the double-ridged waveguide.

6. A direction coupler comprising: means for coupling a section of waveguide having a first port and a second port and stripline circuitry having a third port and fourth port, the first and the second port connected in series between two devices, each device capable of transmitting and receiving R.F. energy, and the third and fourth port connected to test circuitry for testing R.F. energy, said coupling means being adapted to couple R.F. energy from the waveguide to the microstrip circuitry so that R.F. energy entering the first port exits the second port and the fourth port and R.F. energy entering the second port exits the first port and the third port, the R.F. energy having an E-plane electric field; said coupling means comprising:
    (a) a section of waveguide interconnecting the first and the second port having an inner cavity formed by a first and a second pair of opposing walls, the first pair of opposing walls being perpendicular to the E-plane of the R.F. energy;
    (b) stripline circuitry disposed in approximately the center of one of the first pair of opposing walls and interconnecting the third and the fourth ports, such circuitry including a plurality of probes spaced at quarter-wavelength intervals of the R.F. energy to couple with the E-plane electric field in the inner cavity; and
    (c) a strip of dielectric material disposed in the inner cavity adjacent the plurality of probes in such cavity, such strip of dielectric material being shaped to maintain a substantially constant characteristic impedance within the section of waveguide.

7. A directional coupler comprising:
    (a) a section of waveguide having an inner cavity;
    (b) means for coupling radio frequency (R.F.) energy between the section of waveguide and stripline circuitry, said coupling means including the stripline circuitry having a plurality of probes disposed in the inner cavity and spaced at intervals of one-quarter wavelength of the R.F. energy; and
    (c) means for providing a strip of dielectric material disposed in the inner cavity of the waveguide for maintaining a velocity of propagation of the R.F. energy in the waveguide approximately equal to a velocity of propagation of the R.F. energy in the stripline circuitry.

8. The directional coupler as recited in claim 7 comprising means for maintaining a substantially constant impedance within the section of waveguide.

9. A transducer for coupling radio frequency (R.F.) energy comprising:
    (a) a section of waveguide having an inner cavity;
    (b) means for coupling R.F. energy between the section of waveguide and stripline circuitry, the stripline circuitry having a plurality of probes disposed in the inner cavity and spaced at intervals of substantially one-quarter wavelength of the R.F. energy; and
    (c) a strip of dielectric material disposed in the inner cavity of the waveguide so that each one of the plurality of probes is embedded in the strip of dielectric material.

* * * * *